US011683941B2

(12) United States Patent
Reznicek et al.

(10) Patent No.: US 11,683,941 B2
(45) Date of Patent: Jun. 20, 2023

(54) RESISTIVE RANDOM ACCESS MEMORY INTEGRATED WITH VERTICAL TRANSPORT FIELD EFFECT TRANSISTORS

(71) Applicant: INTERNATIONAL BUSINESS MACHINES CORPORATION, Armonk, NY (US)

(72) Inventors: Alexander Reznicek, Troy, NY (US); Karthik Balakrishnan, Scarsdale, NY (US); Bahman Hekmatshoartabari, White Plains, NY (US); Takashi Ando, Eastchester, NY (US)

(73) Assignee: International Business Machines Corporation, Armonk, NY (US)

( * ) Notice: Subject to any disclaimer, the term of this patent is extended or adjusted under 35 U.S.C. 154(b) by 332 days.

(21) Appl. No.: 16/701,194

(22) Filed: Dec. 3, 2019

(65) Prior Publication Data
US 2021/0167129 A1 Jun. 3, 2021

(51) Int. Cl.
*H10B 63/00* (2023.01)
*H10N 70/00* (2023.01)
*H10N 70/20* (2023.01)

(52) U.S. Cl.
CPC .......... *H10B 63/34* (2023.02); *H10N 70/066* (2023.02); *H10N 70/24* (2023.02); *H10N 70/821* (2023.02); *H10N 70/841* (2023.02)

(58) Field of Classification Search
None
See application file for complete search history.

(56) References Cited

U.S. PATENT DOCUMENTS 9,076,523 B2  7/2015 Lee
9,099,385 B2  8/2015 Petti
(Continued)

FOREIGN PATENT DOCUMENTS

CN   105845174 A   8/2016
CN   114747016 A   7/2022
(Continued)

OTHER PUBLICATIONS

Notification of Transmittal of the International Search Report and the Written Opinion of the International Searching Authority, or the Declaration, dated Mar. 9, 2021, File Reference P201807950, International application No. PCT/IB2020/061228, 10 pages.
(Continued)

*Primary Examiner* — Khaja Ahmad
(74) *Attorney, Agent, or Firm* — L. Jeffrey Kelly

(57) ABSTRACT

A semiconductor structure may include two vertical transport field effect transistors comprising a top source drain, a bottom source drain, and an epitaxial channel and a resistive random access memory between the two vertical transport field effect transistors, the resistive random access memory may include an oxide layer, a top electrode, and a bottom electrode, wherein the oxide layer may contact the top source drain of the two vertical field effect transistor. The top source drain may function as the bottom electrode of the resistive random access memory. The semiconductor structure may include a shallow trench isolation between the two vertical transport field effect transistors, the shallow trench isolation may be embedded in a first spacer, a doped source, and a portion of a substrate.

20 Claims, 15 Drawing Sheets

(56) References Cited

U.S. PATENT DOCUMENTS

| | | | |
|---|---|---|---|
| 9,331,279 | B2 | 5/2016 | Pramanik |
| 9,525,064 | B1 | 12/2016 | Balakrishnan et al. |
| 9,647,123 | B1* | 5/2017 | Balakrishnan ...... H01L 29/7802 |
| 9,780,088 | B1* | 10/2017 | Balakrishnan .... H01L 29/78696 |
| 9,806,173 | B2 | 10/2017 | Balakrishnan |
| 10,008,596 | B2 | 6/2018 | Balakrishnan et al. |
| 10,269,868 | B1* | 4/2019 | Yang ................... H01L 29/0847 |
| 2010/0295009 | A1 | 11/2010 | Lung |
| 2010/0295123 | A1* | 11/2010 | Lung ................... H01L 27/2454 257/334 |
| 2011/0006377 | A1* | 1/2011 | Lee ..................... H01L 45/1233 438/455 |
| 2011/0305074 | A1 | 12/2011 | Lung |
| 2012/0080725 | A1* | 4/2012 | Manos .................. H10B 61/22 257/329 |
| 2013/0334488 | A1* | 12/2013 | Park ....................... H10B 63/80 257/4 |
| 2014/0138609 | A1* | 5/2014 | Satoh ..................... H10B 61/22 257/5 |
| 2018/0069131 | A1* | 3/2018 | Balakrishnan .... H01L 29/78696 |
| 2018/0269329 | A1* | 9/2018 | Balakrishnan ...... H01L 29/7889 |
| 2019/0051703 | A1 | 2/2019 | Sel |
| 2019/0081174 | A1 | 3/2019 | You |
| 2019/0237470 | A1* | 8/2019 | Mine ................... H01L 29/7827 |
| 2020/0098826 | A1* | 3/2020 | Sharma ............. H01L 29/66795 |

FOREIGN PATENT DOCUMENTS

| | | |
|---|---|---|
| NO | 2018123678 A1 | 7/2018 |
| WO | 2021111266 A1 | 6/2021 |

OTHER PUBLICATIONS

Chang et al., "A 3T1R Nonvolatile TCAM Using MLC ReRAM for Frequent-Off Instant-On Filters in IoT and Big-Data Processing", IEEE Journal of Solid-State Circuits, vol. 52 No. 6, Jun. 2017, 1664-1679.

IEEE Micro, "A Resistive CAM Processing-in-Storage Architecture for DNA Sequence Alignment", Architectures for the Post-Moore Era, vol. 37, No. 4, p. 20, 2017.

Li et al., "NVsim-CAM: A Circuit-Level Simulator for Emerging Nonvolatile Memory based Content-Addressable Memory", ICCAD '16, Nov. 7-10, 2016, Austin, TX, USA, 2016 ACM, 7 pages.

Lin et al., A 256b-Wordlength ReRAM-based TCAM with 1ns Search-Time and 14× Improvement in Wordlength-EnergyEfficiency-Density Product using 2.5T 1Rcell, ISSCC 2016 / Session 7 / Nonvolatile Memory Solutions / 7.4, pp. 1-3.

Pan et al., "1Kbit FINFET Dielectric (Find) RRAM in Pure 16nm FinFET CMOS Logic Process", © 2015 IEEE, IEDM15-257, pp. 10.5.1-10.5.4.

\* cited by examiner

RESISTIVE RANDOM ACCESS MEMORY INTEGRATED WITH VERTICAL TRANSPORT FIELD EFFECT TRANSISTORS

BACKGROUND

The present invention relates generally to a semiconductor structure and a method of forming the same. More particularly, the present invention relates to a semiconductor structure that includes a resistive random access memory (ReRAM) integrated with vertical transport field effect transistors (VTFETs).

Many modern day electronic devices contain electronic memory. Electronic memory may be volatile memory or non-volatile memory. Non-volatile memory retains its stored data in the absence of power, whereas volatile memory loses its stored data when power is lost. Resistive random access memory (ReRAM or RRAM) is one promising candidate for the next generation of non-volatile memory due to its simple structure and its compatibility with complementary metal-oxide-semiconductor (CMOS) logic fabrication processes.

Resistive random access memory works by changing the resistance across a dielectric solid-state material. A typical ReRAM consists of a bottom electrode, a top electrode, and an oxide layer between the two electrodes.

SUMMARY

According to one embodiment of the present invention, a semiconductor structure is provided. The semiconductor structure may include two vertical transport field effect transistors comprising a top source drain, a bottom source drain, and an epitaxial channel and a resistive random access memory between the two vertical transport field effect transistors. The resistive random access memory may include an oxide layer, a top electrode, and a bottom electrode, wherein the oxide layer may contact the top source drain of the two vertical field effect transistor. The top source drain may function as the bottom electrode of the resistive random access memory. The semiconductor structure may include a shallow trench isolation between the two vertical transport field effect transistors. The shallow trench isolation may be embedded in a first spacer, a doped source, and a portion of a substrate. The two vertical transport field effect transistors may include a metal gate material surrounding the epitaxial channel and a shallow trench isolation between the two vertical transport field effect transistors. The shallow trench isolation may be embedded in a first spacer, a doped source, and a portion of a substrate, wherein the doped source may be arranged on a substrate. The doped source may include a doped region on the substrate including a first dopant, and a counter-doped layer including a second dopant that is different than the first dopant may be arranged between the doped region and the substrate. The semiconductor structure may include a metal fill between the two vertical transport field effect transistors, the metal fill may be arranged on the top electrode. The semiconductor structure may also include source contacts contacting the doped source, gate contacts contacting the metal gate material, and an oxide resistive random access memory contact structure contacting a top portion of a metal fill.

According to another embodiment of the present invention, a semiconductor structure is provided. The semiconductor structure may include two or more two vertical transport field effect transistors including a top source drain, a bottom source drain, and an epitaxial channel and a resistive random access memory between the two or more vertical transport field effect transistors, the resistive random access memory comprising an oxide layer, a top electrode, and a bottom electrode, wherein the oxide layer contacts the top source drain of the two vertical field effect transistor. The top source drain may function as a bottom electrode of the oxide resistive random access memory. The structure may include two or more shallow trench isolations between the two or more vertical transport field effect transistors, the two or more shallow trench isolations may be embedded in a first spacer, a doped source, and a portion of a substrate. The two or more vertical transport field effect transistors may include metal gate material surrounding the epitaxial channel and two or more shallow trench isolations between the two vertical transport field effect transistors. The two or more shallow trench isolations may be embedded in a first spacer, a doped source, and a portion of a substrate, wherein the doped source may be arranged on a substrate. The doped source may include a doped region on the substrate including a first dopant, and a counter-doped layer including a second dopant that is different than the first dopant may be arranged between the doped region and the substrate. The semiconductor structure may include a metal fill between the two or more vertical transport field effect transistors. The metal fill may be arranged on the top electrode. The semiconductor structure may include two or more source contact structures contacting the doped source, two or more gate contact structures contacting the metal gate material, and two or more oxide resistive random access memory contact structure contacting a top portion of a metal fill.

According to another embodiment of the present invention, a method is provided. The method may include forming two vertical transport field effect transistors comprising a top source drain, a bottom source drain, and an epitaxial channel and forming a resistive random access memory between the two vertical transport field effect transistors. The resistive random access memory may include an oxide layer, a top electrode, and a bottom electrode, wherein the oxide layer may contact the top source drain of the two vertical field effect transistor. The top source drain may function as a bottom electrode of the oxide resistive random access memory. The method may include forming a shallow trench isolation between the two vertical transport field effect transistors. The shallow trench isolation may extend from a top surface of a first spacer through a doped source, and a portion of a substrate. The method may include forming a metal gate material surrounding the epitaxial channel and forming a shallow trench isolation between the two vertical transport field effect transistors. The shallow trench isolation may be embedded in a first spacer, a doped source, and a portion of a substrate, wherein the doped source may be arranged on a substrate. The doped source may include a doped region on the substrate including a first dopant, and a counter-doped layer including a second dopant that is different than the first dopant arranged between the doped region and the substrate. The method may include depositing a metal fill between the two vertical transport field effect transistors, the metal fill may be arranged on the top electrode. The method may also include forming two source contact structures contacting the doped source, forming two gate contact structures contacting the metal gate material, and forming an oxide resistive random access memory contact structure contacting a top portion of a metal fill.

BRIEF DESCRIPTION OF THE DRAWINGS

The following detailed description, given by way of example and not intend to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
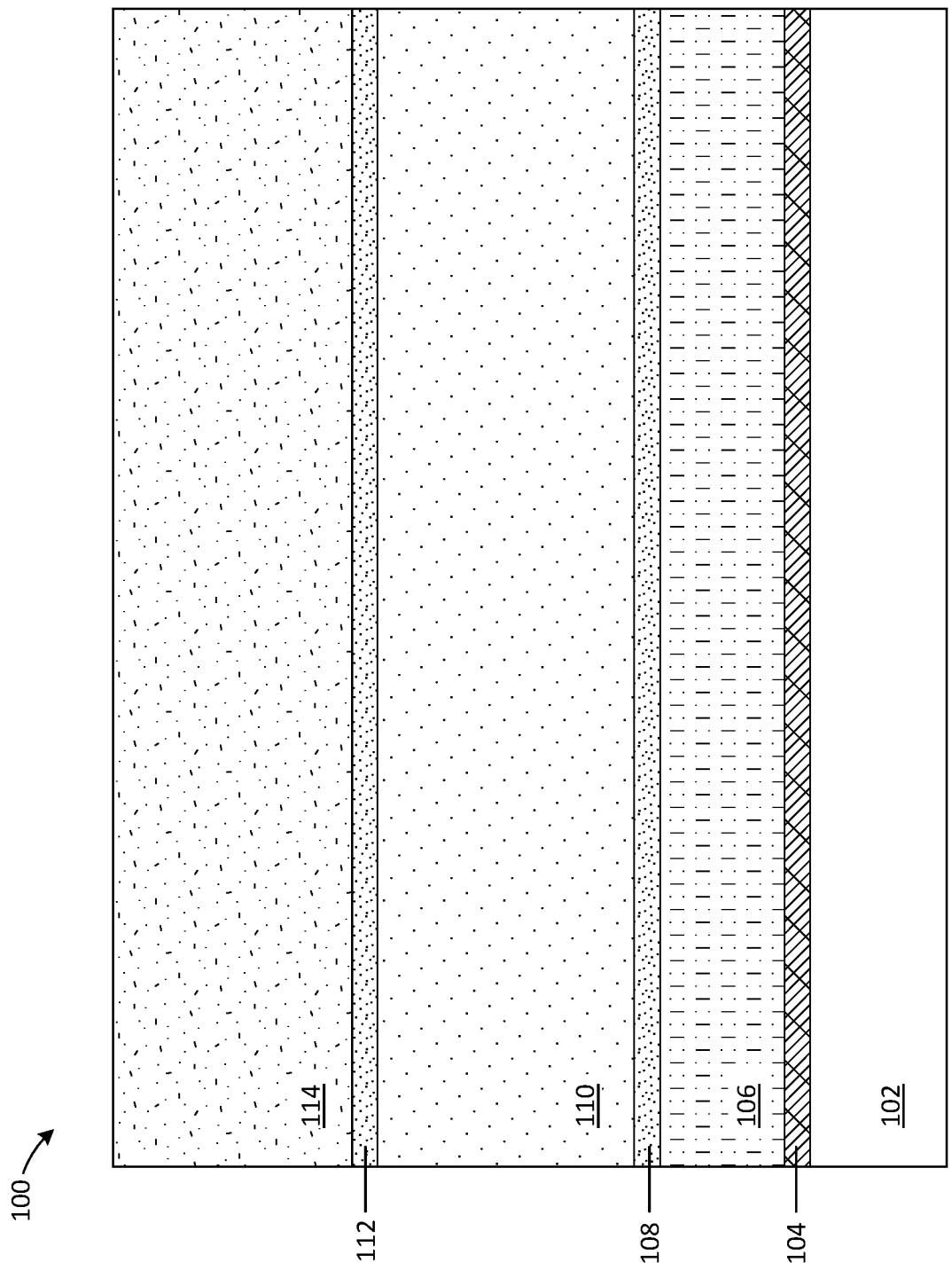
FIG. 1 is a cross section view illustrating a dummy gate and a dielectric capping layer arranged on a substrate according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Embodiments of the present invention relate generally to a semiconductor structure and a method of forming the same. More particularly, the present invention relates to a semiconductor structure that includes a resistive random access memory (ReRAM) integrated with vertical transport field effect transistors (VTFETs).

ReRAM is a type of random-access computer memory that works by changing the resistance across a dielectric solid-state material. ReRAM is a promising technology for high-speed content addressable memory. Some applications of ReRAM may include high-speed search in computer networks, such as, for example, for routing MAC addresses.

Typically, a ReRAM may include a bottom electrode, a top electrode, and an oxide layer between the two electrodes. In an oxide ReRAM, electroforming of current conducting filament is needed. This process relies on randomness and thus the position of the filament of the oxide ReRAM is not well controlled. This results in a higher forming voltage as the ReRAM cell is scaled and higher device variability. As such, there exists a need to form a ReRAM cell that can be scaled.

Embodiments of the present invention propose a two-transistor-two-resistor (2T2R) ReRAM structure. More particularly, embodiments of the present invention propose an oxide ReRAM co-integrated with two vertical transistors using parts of the top source/drain region of the two vertical transistors as bottom electrodes for the ReRAM structure. Embodiments of the present invention propose forming the oxide ReRAM in the facetted epitaxy drain region of the vertical transistor. The facetted epitaxy drain region is redefined to a pointed cone, enhancing the electric field at the tip of the cone.

FIGS. 1-15 illustrate exemplary structure of a 2T2R ReRAM structure as well as a method of making the 2T2R ReRAM structure, in accordance with an embodiment.

Referring now to FIG. 1, a structure 100 is shown, in accordance with an embodiment. The structure 100 may include a substrate 102, a counter-doped layer 104, a doped source 106, a first spacer 108, a dummy gate 110, a second spacer 112, and a dielectric capping layer 114. The substrate 102 may include one or more semiconductor materials. Non-limiting examples of suitable substrate 102 materials may include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. In an embodiment, the substrate 102 may include germanium, The counter-doped layer 104 is deposited onto the top surface of the substrate 102. The doped source 106 is then arranged on the substrate 102 over the counter-doped layer 104. The doped source 106 and the counter-doped layer 104 may be formed on the substrate 102 incorporating dopants into the substrate 102 or forming an epitaxial growth on the substrate 102. The doped source 106 is heavily doped with a dopant, which may be a p-type dopant (e.g., boron or gallium) or an n-type dopant (e.g., phosphorus or arsenic).

The counter-doped layer 104 includes a dopant that is different/opposite the dopant in the doped source 106. For example, when the doped source 106 includes a p-type dopant, the counter-doped layer 104 includes an n-type dopant, and when the doped source 106 includes an n-type dopant, the counter-doped layer 104 includes a p-type dopant. The doped source 106 is heavily doped, including a dopant concentration in a range from about 1019 to about 1022 atoms/cm3. The thickness of the counter-doped layer 104 may be in a range from about 5 to about 50 nm, or from about 10 to about 20 nm. The thickness of the doped source 106 may be in a range from about 50 to about 250 nm, or from about 100 to about 200 nm. The counter-doped layer 104 acts as an insulator, insulating the doped source 106 from the substrate 102 such that electrical current does not dissipate into the substrate 102.

A dummy gate 110 is disposed on the doped source 106 between a first spacer 108 and a second spacer 112. The first spacer 108 is deposited on the doped source 106, the dummy gate 110 is deposited on the first spacer 108, and the second spacer 112 is deposited on the dummy gate 110.

The first spacer 108 and second spacer 112 may include an insulating material, such as, for example, silicon dioxide, silicon nitride, SiOCN, or SiBCN. Other non-limiting examples of materials for the first spacer 108 and the second spacer 112 may include dielectric oxides (e.g., silicon oxide), dielectric nitrides (e.g., silicon nitride), dielectric oxynitrides, or any combination thereof. The first spacer 108 and second spacer 112 materials are deposited by a deposition process, for example, chemical vapor deposition (CVD) or physical vapor deposition (PVD). The first spacer 108 and the second spacer 112 may each have a thickness of about 3 to about 15 nm, or of about 5 to about 10 nm.

The dummy gate 110 may include a sacrificial gate material, for example, amorphous silicon (aSi) or polycrystalline silicon (polysilicon). The sacrificial material may be deposited by a deposition process, including, but not limited to, physical vapor deposition (PVD), chemical vapor deposition (CVD), plasma enhanced chemical vapor deposition (PECVD), inductively coupled plasma chemical vapor deposition (ICP CVD), or any combination thereof. The sacrificial material forming the dummy gate 110 may have a thickness of about 8 nm to about 100 nm, or from about 10 nm to about 30 nm.

A dielectric capping layer 114 is deposited on the second spacer 112 over the dummy gate 110. The dielectric capping layer 114 may also be referred to as an oxide layer. Non-limiting examples of materials for the dielectric capping layer 114 may include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof. The dielectric capping layer 114 may have a thickness in a range from about 30 nm to about 200 nm, or from about 50 nm to about 100 nm.

Figure 2:
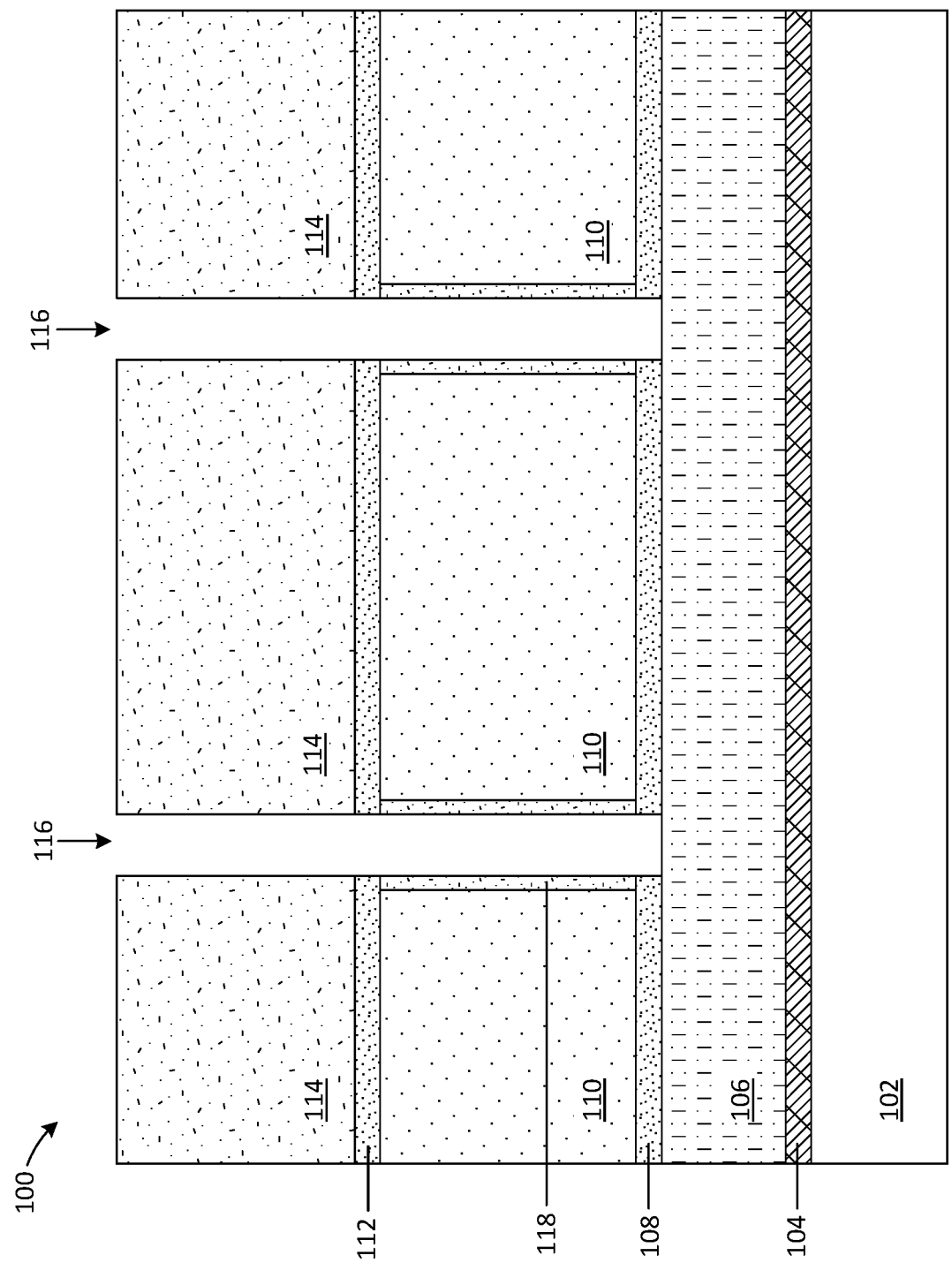
FIG. 2 is a cross section view illustrating a trench formed to expose a doped source according to an exemplary embodiment.

Referring now to FIG. 2, the structure 100 with two trenches 116 is shown, in accordance with an embodiment. Each trench 116 undergoes a manufacturing process, described herein below, to form a vertical transistor. The trenches 116 extend from a top surface of the dielectric capping layer 114 to the doped source 106, exposing the top surface of the doped source 106. The trenches 116 are formed by performing an etch process that is selective to (will not substantially remove) the doped source 106 material. The etch process may be, for example, a reactive ion etch.

Multiple etching processes may be performed to form the trenches 116 within the structure 100. For example, a first etching process may be performed to remove a portion of the dielectric capping layer 114 selective to the material of the second spacer 112. A second etching process may then be performed to remove a portion of the second spacer 112, which underlies the portion of the trenches 116 formed from the first etching process, selective to the material of the dummy gate 110. A third etching process may then be performed to remove a portion of the dummy gate 110, which underlies the portion of the trenches 116 formed from the second etching process, selective to the material of the first spacer 108. A fourth etching process may then be performed to remove a portion of the first spacer 108, thereby exposing a top surface of the doped source 106. The resulting trenches 116 may extend through a top surface of the dielectric capping layer 114 down to a top surface of an exposed portion of the doped source 106. The width of the trenches 116 may be about 3 nm to about 20 nm, or about 5 nm to about 10 nm. The depth of the trenches 116 may be about 50 nm to about 300 nm, or from about 100 nm to about 200 nm.

Once the trenches 116 are formed, portions of the dummy gate 110 sidewalls are oxidized. The oxidation allows for a thin layer of oxide 118 to be formed along the sidewalls of the trenches 116. The oxidation may be performed by a plasma oxidation process or other oxidation process that forms a thin oxide 118 layer. A portion of the first spacer 108 or the doped source 106 also may be oxidized. However, any oxide formed in these regions may be removed before performing additional steps described herein with reference to FIGS. 3-15.

Figure 3:
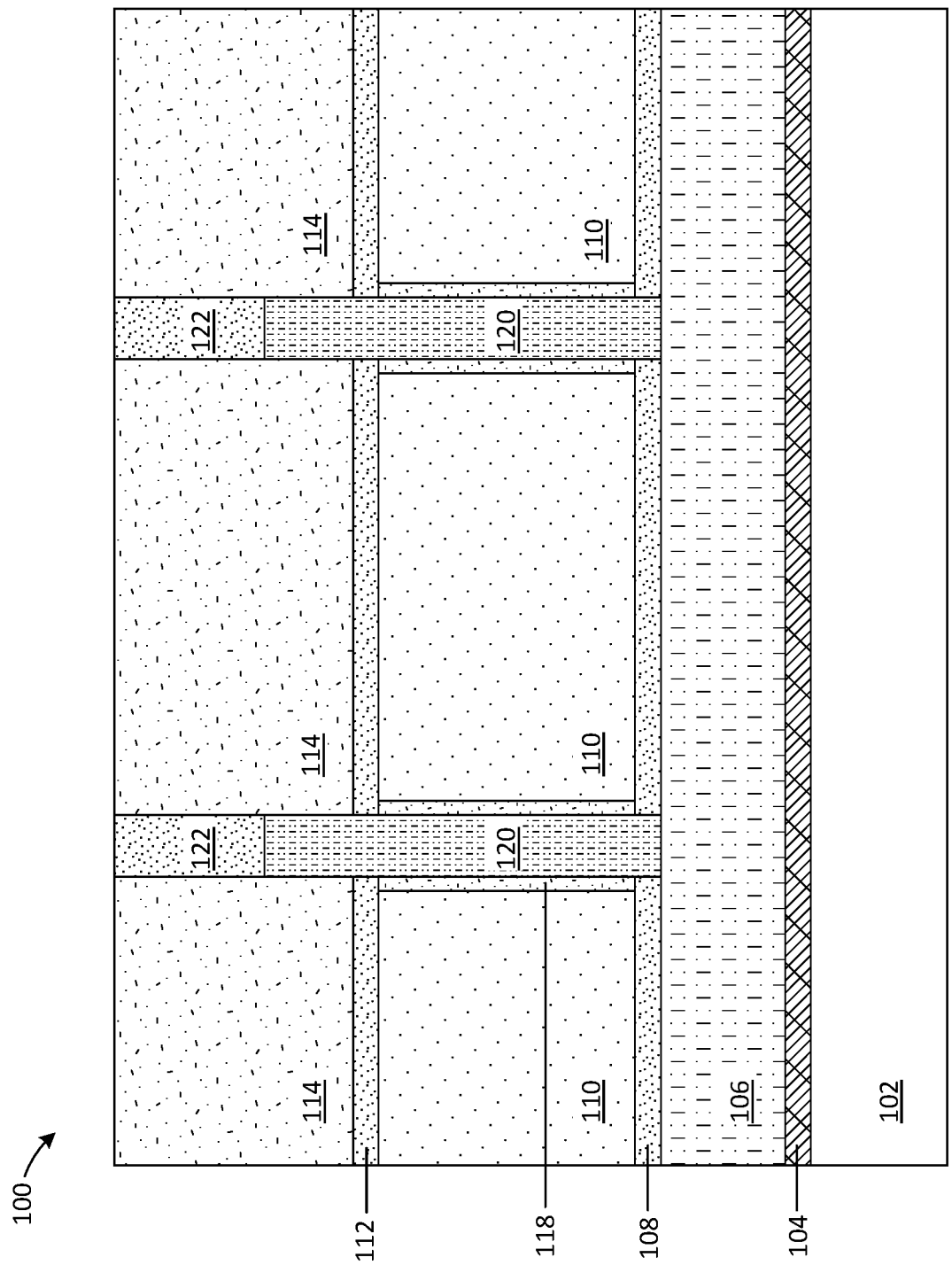
FIG. 3 is a cross section view illustrating an epitaxial layer and a dielectric material according to an exemplary embodiment.

Referring now to FIG. 3, the structure 100 with epitaxial channels 120 and dielectric materials 122, is shown in accordance with an embodiment. Once the portions of the dummy gate 110 sidewalls are oxidized, an epitaxial layer is grown on the top surface of the doped source 106 to form the epitaxial channels 120. The epitaxial growth may include an epitaxial semiconductor material, and the epitaxial growth and/or deposition processes may be selective to forming on semiconductor surface, and do not deposit material on other surfaces, such as the oxide 118, the first spacer 108 or the second spacer 112.

The epitaxial channels 120 may be grown using a suitable growth process, for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

The sources for the epitaxial channel material may be, for example, silicon, germanium, or a combination thereof. The gas source for the deposition of epitaxial semiconductor material may include a silicon-containing gas source, a germanium-containing gas source, or a combination thereof. For example, an epitaxial silicon layer may be deposited from a silicon gas source that is selected from the group consisting of silane, disilane, trisilane, tetrasilane, hexachlorodisilane, tetrachlorosilane, dichlorosilane, trichlorosilane, and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used.

During the growth process, the epitaxial growth in the epitaxial channels 120 may extend over the dielectric capping layer 114 (not illustrated). A planarization process, such as, for example, a chemical mechanical polishing (CMP) process, may be used to remove excess epitaxial growth over the dielectric capping layer 114. In addition, the epitaxial channel 120 may be partially recessed and then back filled with a dielectric material 122. The epitaxial channel 120 may be partially recessed to a level that is still within the dielectric capping layer 114 but above the second spacer 112. The epitaxial channel 120 may be recessed by etching, for example, by a reactive ion etch or a wet etch process.

The opening formed over the recessed epitaxial channel 120 is filled with a dielectric material. The dielectric material 122 may be a dielectric oxide (e.g., silicon oxide), a dielectric nitride (e.g., silicon nitride), a dielectric oxynitride, or any combination thereof. The dielectric material 122 is deposited by a deposition process, for example, chemical vapor deposition (CVD) or physical vapor deposition (PVD). After deposition, the dielectric material 122 is planarized, by for example, CMP. The dielectric material 122 forms a dielectric cap over the epitaxial channel 120.

Figure 4:
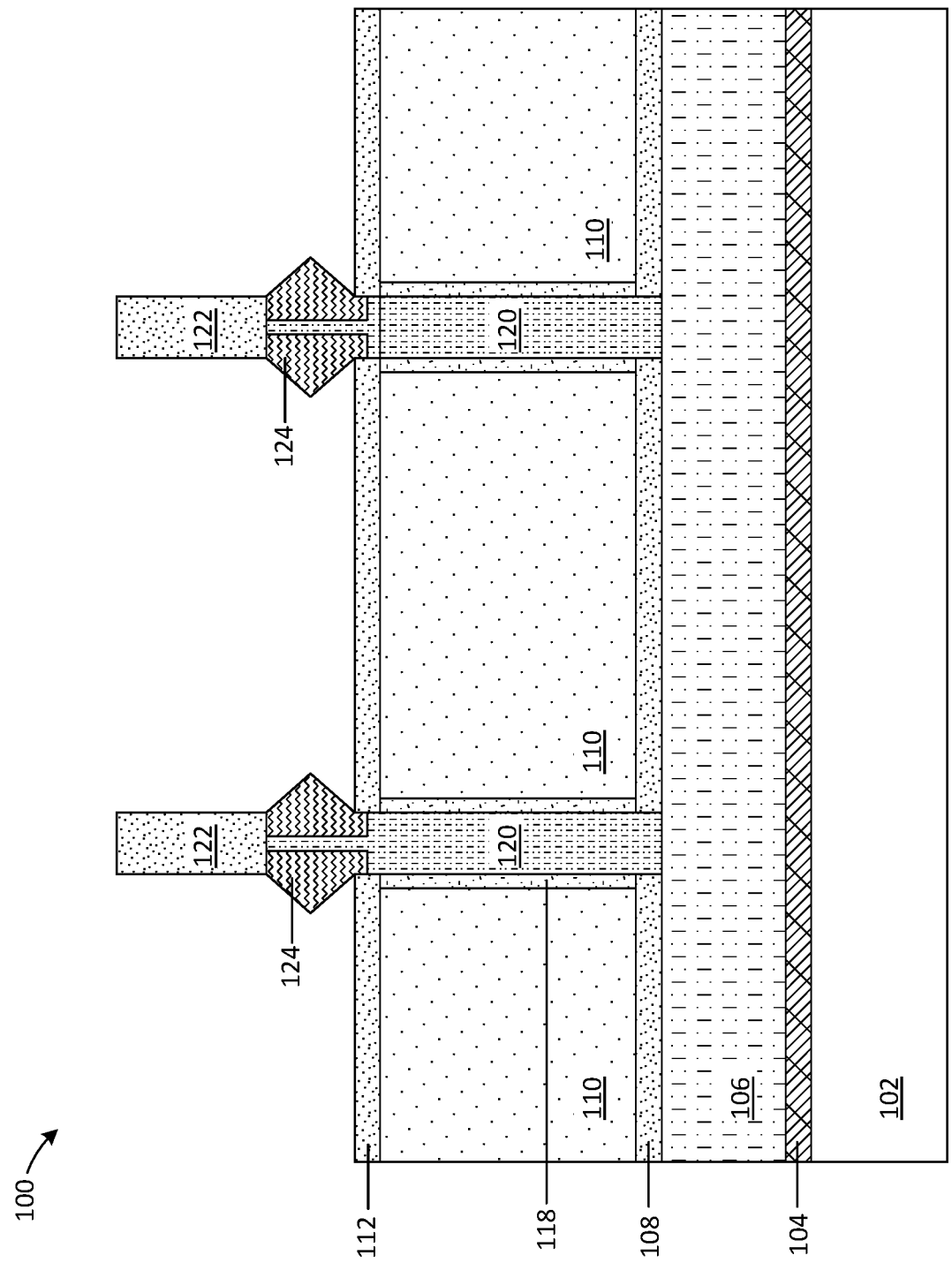
FIG. 4 is a cross section view illustrating forming a top source drain on the epitaxial channel according to an exemplary embodiment.

Referring now to FIG. 4, the structure 100 with a top source drain 124 is show, in accordance with an embodiment. Substantially all of the dielectric capping layer 114 is removed, thereby exposing the top surface of the second spacer 112. The dielectric capping layer 114 may be etched using a process that is selective to (will not substantially remove) the second spacer 112. Once the dielectric capping layer 114 is removed, the top source drain 124 is epitaxially grown from an exposed sidewall of the epitaxial channel 120. The top source drain 124 of the source/drain is arranged between the dielectric material 122 and the epitaxial channel 120. The top source drain 124 is also arranged between the dielectric material 122 and the dummy gate 110. A portion of the epitaxial channel 120 over the second spacer 112 may be recessed along sidewalls before forming the top source drain 124. The top source drain 124 is the facetted epitaxy source drain region of the vertical transistor. The faceted top source drain 124 grows in a shape of a pointed cone, wherein the points of the top source drain 124 extend horizontally away from the epitaxial channel 120. The pointed cone shape of the top source drain 124 enhances the electric field at the tip of the cone.

Figure 5:
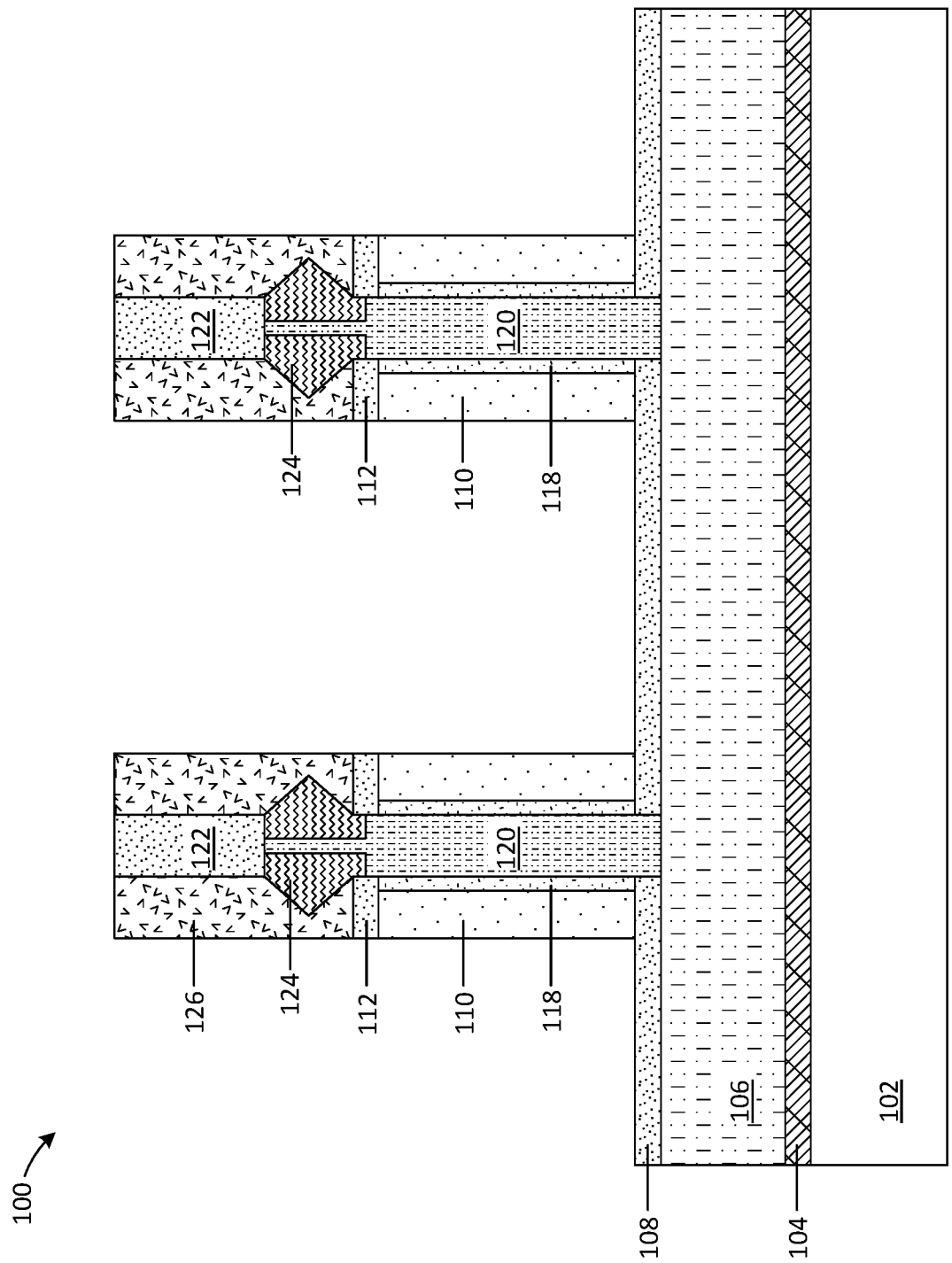
FIG. 5 is a cross section view illustrating depositing a spacer on the top source drain according to an exemplary embodiment.

Referring now to FIG. 5, the structure 100 with a third spacer 126, is shown in accordance with an embodiment. The third spacer 126 is deposited on the top source drain 124. The third spacer 126 protects the top source drain 124. The third spacer 126 is also disposed on a sidewall of the dielectric material 122. The third spacer 126 may include an insulating material, for example, dielectric oxides (e.g., silicon oxide), dielectric nitrides (e.g., silicon nitride), dielectric oxynitrides, or any combination thereof. The third spacer 126 material is deposited by a deposition process, for example, chemical vapor deposition (CVD) or physical vapor deposition (PVD). The spacer material may be etched by a dry etch process, for example, a RIE process, such that it covers the top source drain 124 and is removed from a surface of the dielectric material 122 and the second spacer 112.

Once the third spacer 126 is deposited, portions of the second spacer 112 and the dummy gate 110 are removed. The second spacer 112 and the dummy gate 110 are recessed to remove portions that extend horizontally beyond the third spacer 126 material. An etch process that is selective to (will not substantially remove) the first spacer 108 is performed. The etch process may be a dry etch process, such as an RIE process.

Figure 6:
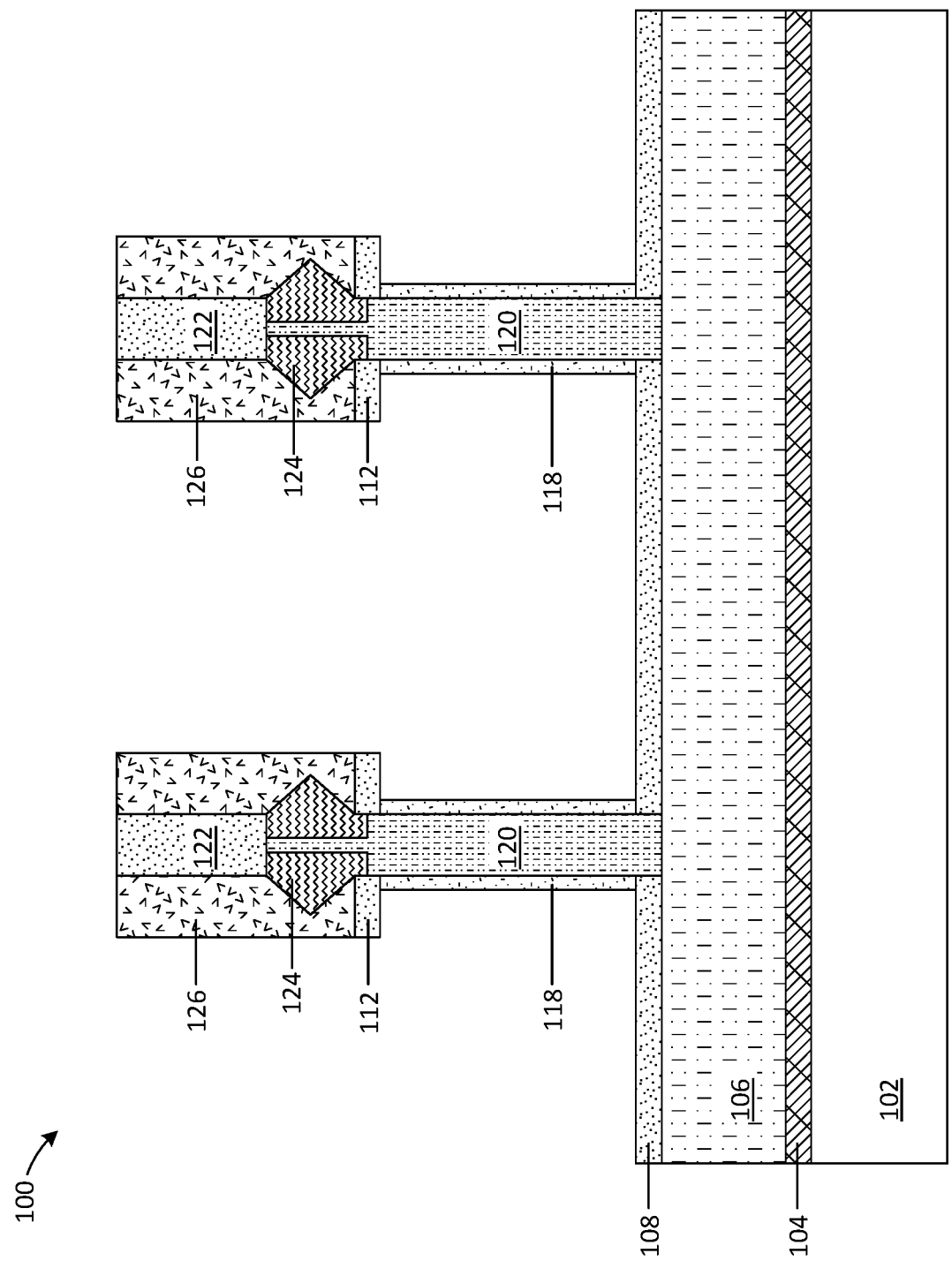
FIG. 6 is a cross section view illustrating removing the dummy gate according to an exemplary embodiment.

Referring now to FIG. 6, the structure 100 with the remaining dummy gate 110 removed, is shown in accordance with an embodiment. Removing the remaining dummy gate 110 beneath the third spacer 126 exposes the oxide 118. The dummy gate 110 may be removed by a wet etch process, for example, a process that includes hot ammonia.

Figure 7:
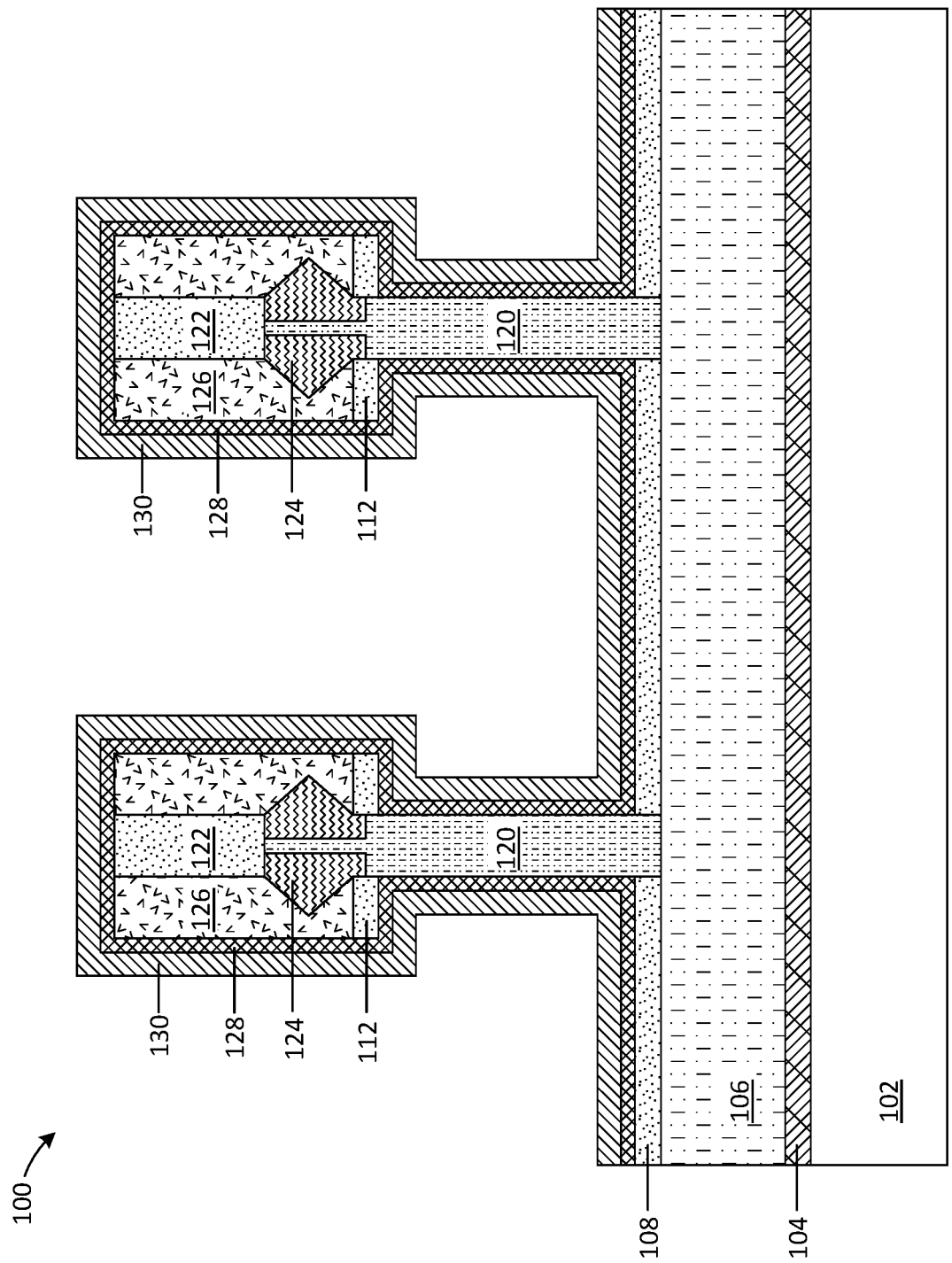
FIG. 7 is a cross section view illustrating depositing a gate dielectric material and a work function metal according to an exemplary embodiment.

Referring now to FIG. 7, the structure 100 with a gate dielectric material 128 and a work function metal 130 is shown, in accordance with an embodiment. Before the gate dielectric material 128 is deposited, the remaining portions of the oxide 118 are removed such that the sidewalls of the epitaxial channel 120 are exposed. The gate dielectric material 128 is then conformally deposited along the top surface of the structure 100. The work function metal 130 is then conformally deposited onto the top portions of the gate dielectric material 128. The gate dielectric material 128 and the work function metal 130 form a portion of the gate stack that replaces the dummy gate 110. The gate dielectric material 128 and the work function metal 130 are disposed on the first spacer 108, the epitaxial channel 120, the third spacer 126, and the remaining portions of the second spacer 112 beneath the top source drain 124.

The gate dielectric material(s) 128 can be a dielectric material having a dielectric constant greater than 3.9, 7.0, or 10.0. Non-limiting examples of suitable materials for the gate dielectric material 128 include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric material 128 separates the epitaxial channel 120 from the work function metal 130, reducing the leakage current effect while increasing the capacitance of the work function metal 130. The gate dielectric material 128 layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the gate dielectric material 128 may vary depending on the deposition process as well as the composition and number of high-k dielectric materials used.

The work function metal(s) 130 may be disposed over the gate dielectric material 128. The type of work function metal(s) 130 depends on the type of a transistor. Non-limiting examples of suitable work function metals 130 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) 130 may be deposited by a suitable deposition process, for example, CVD, PECVD, PVD, plating, thermal or e-beam evaporation, and sputtering.

Figure 8:
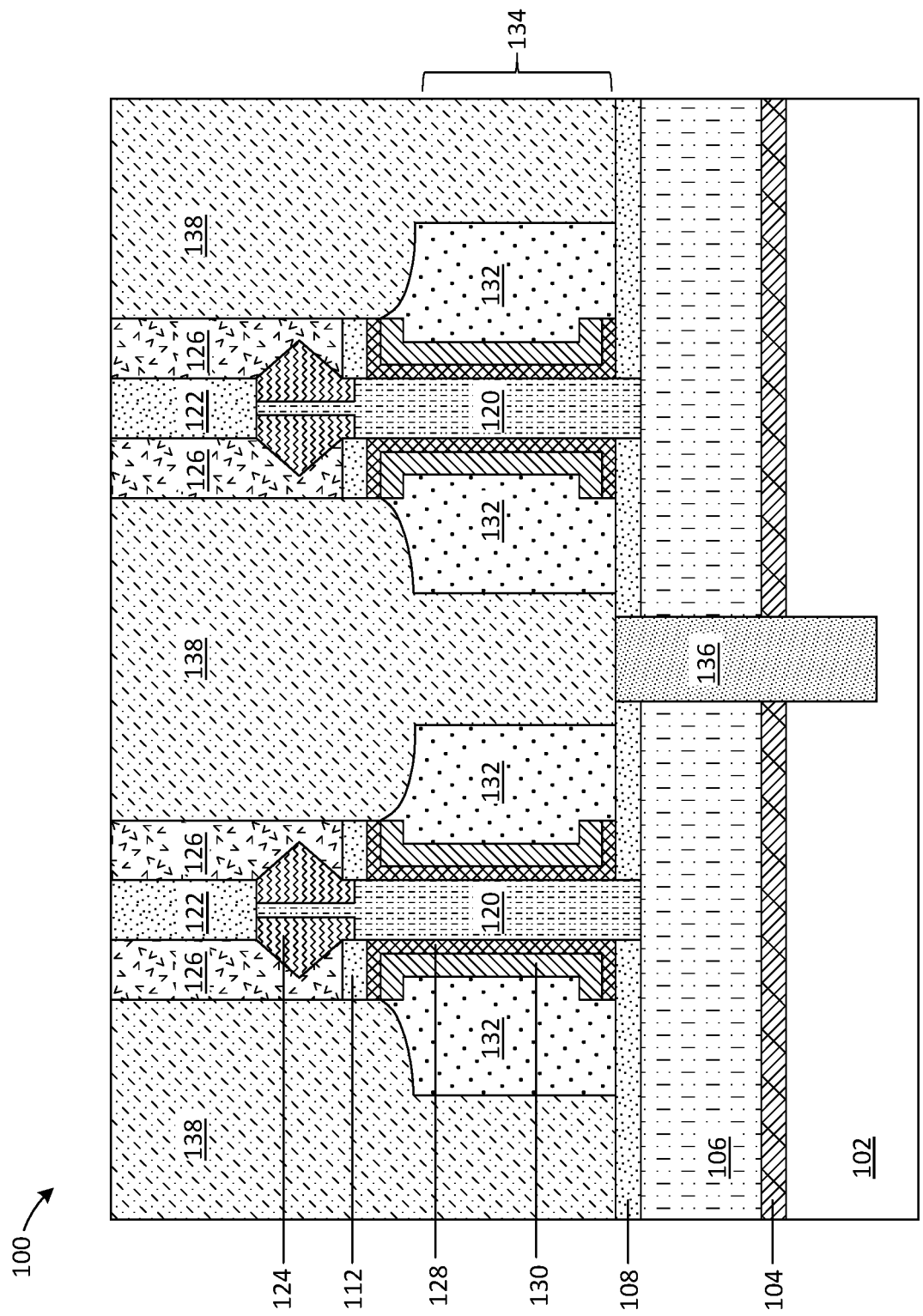
FIG. 8 is a cross section view illustrating depositing an interlayer dielectric according to an exemplary embodiment.

Referring now to FIG. 8, the structure 100 with a metal gate material 132, a shallow trench isolation (STI) 136 and an interlayer dielectric (ILD) 138 is shown, in accordance with an embodiment. The structure 100 is first filled with the metal gate material 132 such that top portions of the metal gate material 132 and top portions of the dielectric material 122 and the third spacer 126 are substantially flush. The metal gate material 132 is deposited over the gate dielectric material(s) 128 and work function metals 130. The metal gate material 132, the work function metal 130, and the gate dielectric material 128 may be collectively referred to as a gate stack. Non-limiting examples of the metal gate material 132 may include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering.

The metal gate material 132 is then partially recessed by an etch process, for example, a reactive ion etch process to expose portions of the gate dielectric material 128 and the work function metal 130. After which, an anisotropic etch, such as, for example a RIE process, may be performed to recess the gate dielectric material 128 and the work function metal 130 down to the level of the metal gate material 132. Further, a mask may be disposed on the metal gate material 132 and subsequently patterned. The pattern is transferred into the metal gate material 132 to remove a portion of the metal gate material 132 and define a gate 134. In addition, the gate dielectric material 128 and work function metal 130 are also etched during this step. A combination of RIE processes may be performed. A portion of the first spacer 108 is arranged between the gate stack of the gate 134 and the doped source 106.

Forming the shallow trench isolation (STI) 136 may be done in many ways. In an embodiment, a single etching process, or multiple etching processes, may also be performed to remove, between the two gates 134, portions of the first spacer 108, the doped source 106, the counter-doped layer 104, and the substrate 102. The resulting trench (not illustrated) may extend from the top surface of the first spacer 108 through a portion of the substrate 102. The trench is then filled with a dielectric material forming the STI 136. The STI 136 is a form of a dielectric plug that separates the two transistors such that electrical current applied to one transistor has no effect on the second transistor. Typically, the STI 136 extends through a portion of the substrate 102 to a depth that allows for the two transistors to be electrically separated.

In an alternative embodiment, the STI 136 may be formed before the work function metal 130 and the metal gate material 132 are deposited. For example, the STI 136 may be formed before the oxide 118 is removed, as described herein with reference to FIG. 7. In another example, STI 136 may be formed before the remaining portions of the dummy gate 110 are removed, as described herein with reference to FIG. 5. In both cases, a trench is etched between the two transistor structures and then filled with a dielectric material forming the STI 136, before the work function metal 130 and the metal gate material 132 are deposited.

With continued reference to FIG. 8, an interlayer dielectric (ILD) 138 may be deposited such that top surface of the ILD 138 is substantially flush with the top surfaces of the dielectric material 122 and the third spacer 126. The ILD 138 may be formed from, for example, a low-k dielectric material (with k<4.0), including but not limited to, silicon oxide, spin-on-glass, a flowable oxide, a high density plasma oxide, borophosphosilicate glass (BPSG), or any combination thereof. The ILD 138 is deposited by a deposition process, including, but not limited to CVD, PVD, plasma enhanced CVD, atomic layer deposition (ALD), evaporation, chemical solution deposition, or like processes. The resultant structure 100 includes two vertical transistors separated by the STI 136. Each vertical transistor includes the gate 134.

Figure 9:
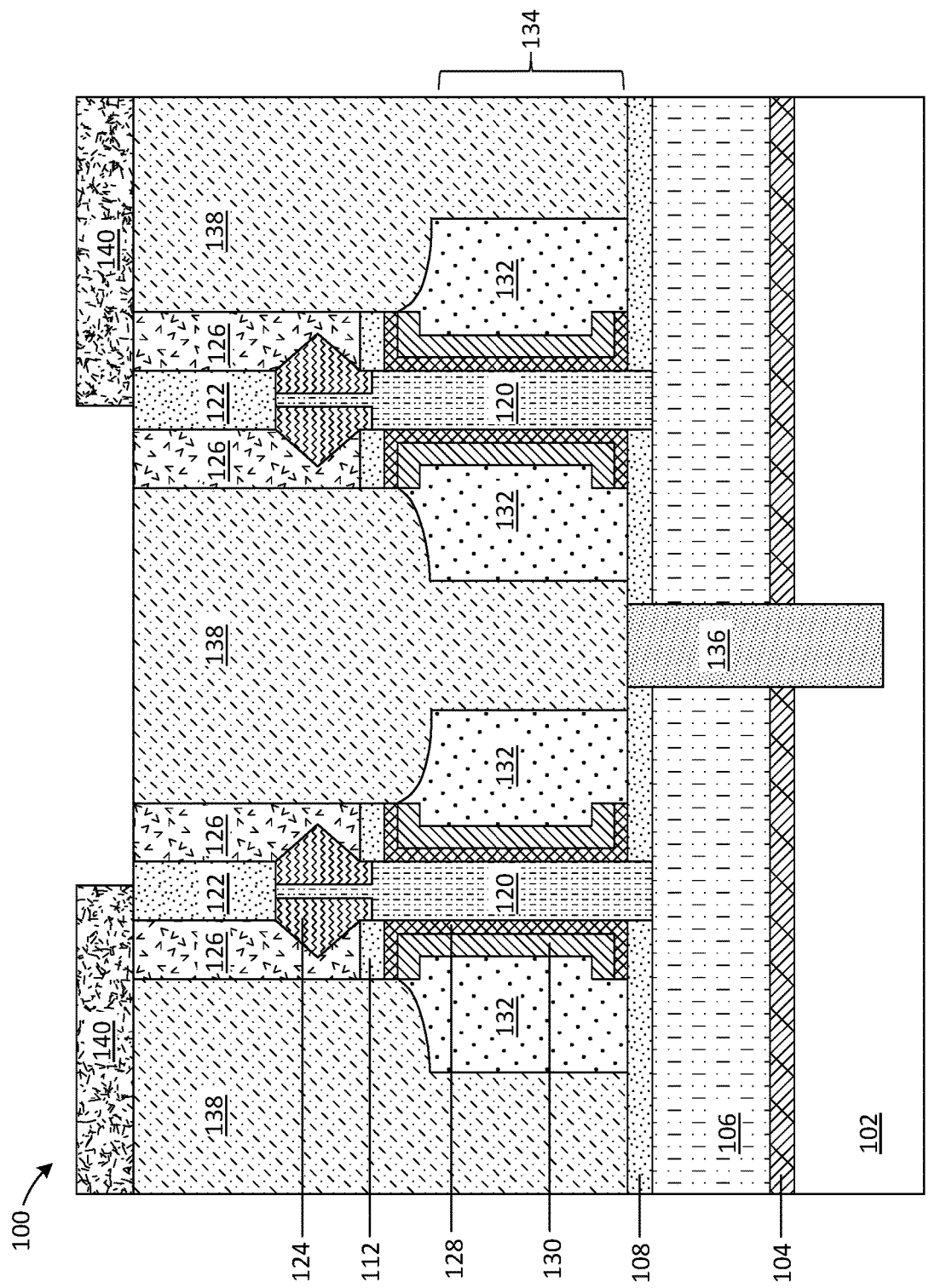
FIG. 9 is a cross section view illustrating depositing a mask to cover portions of the third spacer according to an exemplary embodiment.

Referring now to FIG. 9, the structure 100 with a mask 140 is shown, in accordance with an embodiment. After the ILD 138 is deposited, a planarization process, such as, for example, a CMP process, may be used to remove excess ILD 138 from the top surface of the structure 100. A mask 140 is then deposited onto the top surface of the structure 100 such that only a portion of the third spacer 126 of each vertical transistor and a portion of the dielectric material 122 are covered. The ILD 138 between the two vertical transistors is not covered by the mask 140. Rather, the ILD 138 between the two vertical transistors is exposed. The mask 140 may be made of material that is resistant to the etch process, thus protecting the portions of the structure 100 that are covered by the mask 140. The mask 140 is deposited to protect the covered surfaces when the structure 100 is further processed to form the ReRAM structure.

Figure 10:
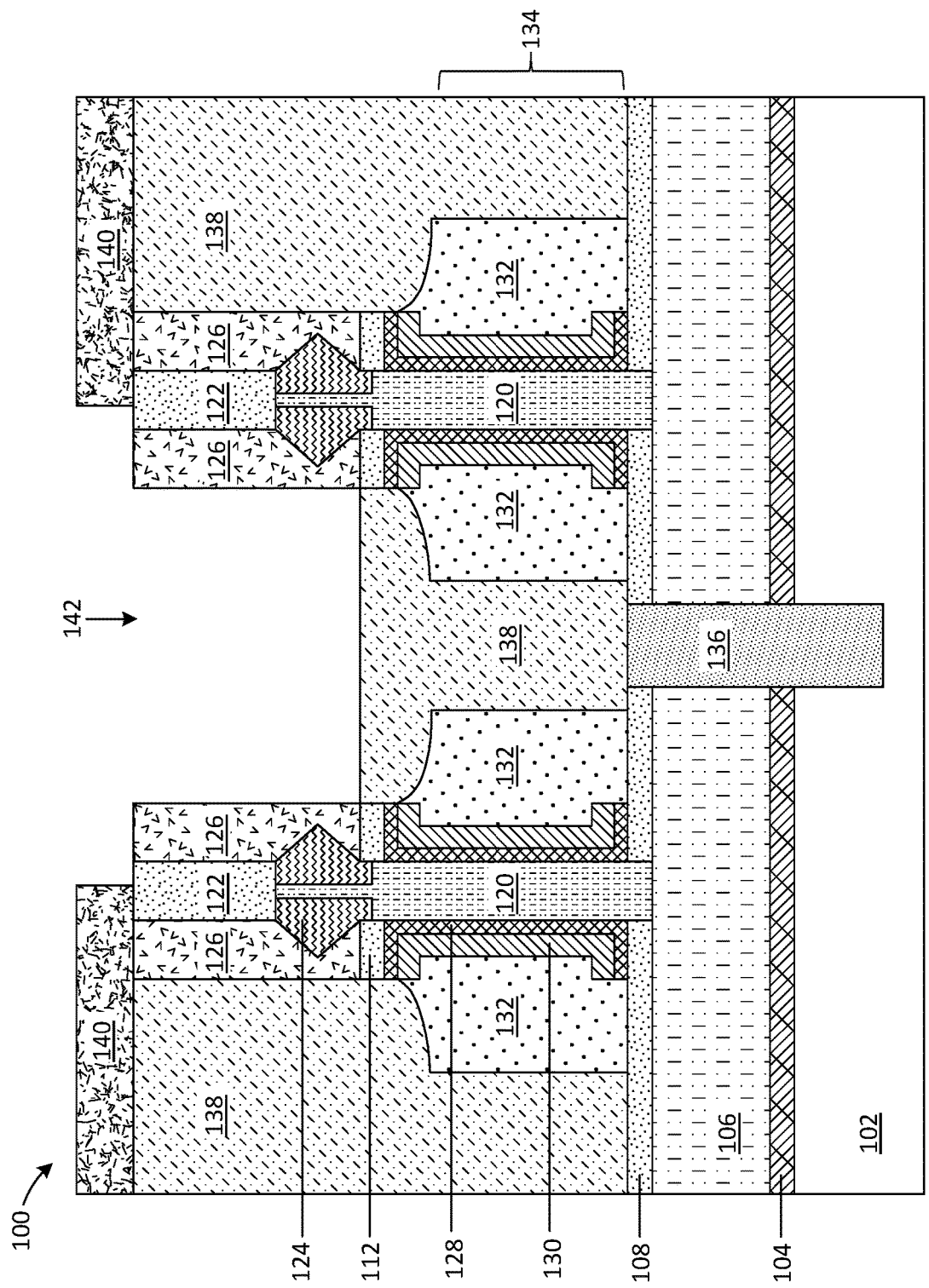
FIG. 10 is a cross section view illustrating recessing a portion of the interlayer dielectric according to an exemplary embodiment.

Referring now to FIG. 10, the structure 100 with recessed portions of the ILD 138, is shown in accordance with an embodiment. The exposed portion of the ILD 138 located between the two vertical transistors is removed by performing an etch process that is selective to (will not substantially remove) the third spacer 126 and the dielectric material 122. The etch process may be, for example, a reactive ion etch. Once the ILD 138 is recessed, an opening 142 is formed between the two transistors. The opening 142 is formed so that it may be subsequently backfilled with other material, as is described herein with reference to FIGS. 12-14.

Figure 11:
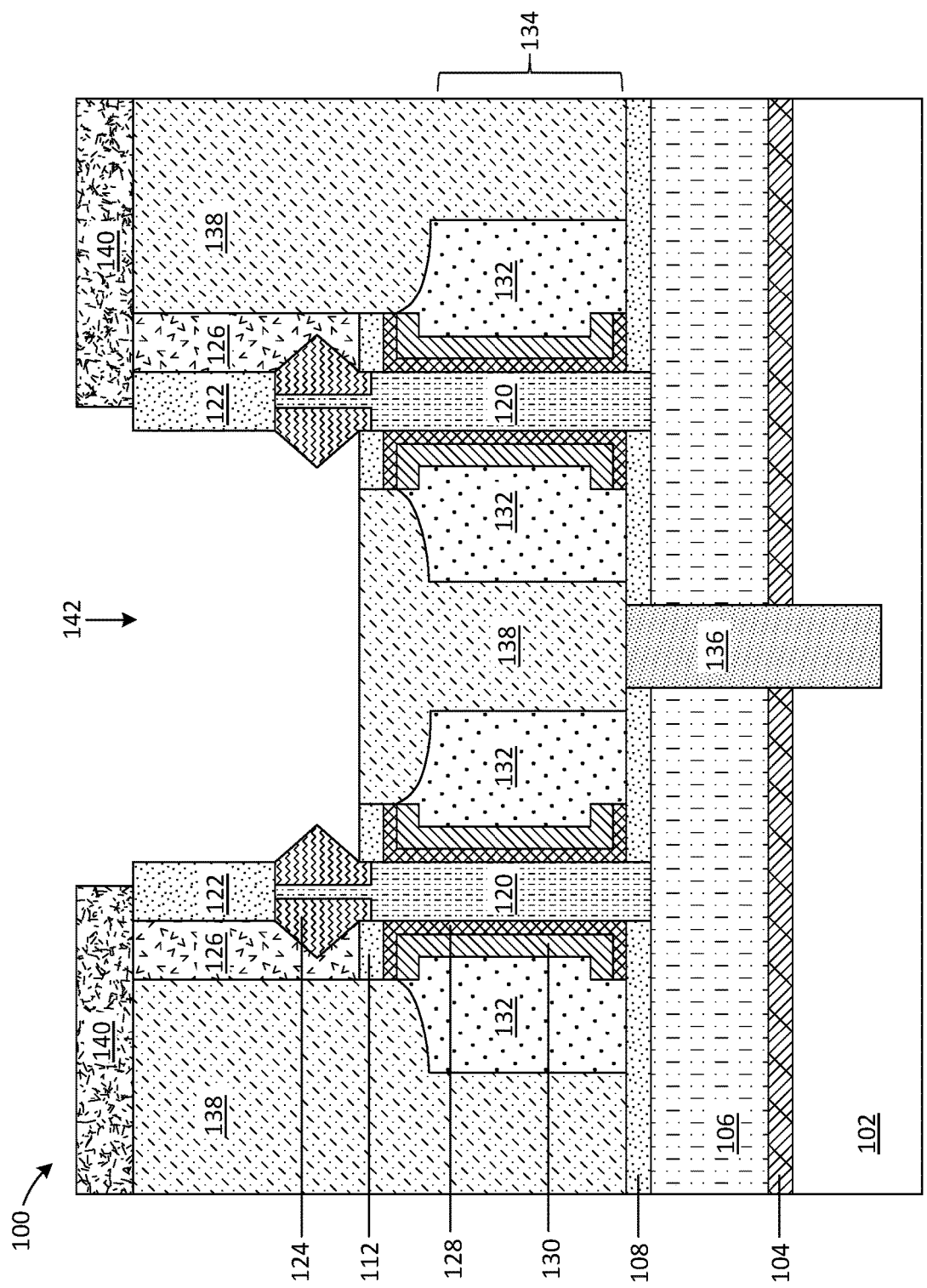
FIG. 11 is a cross section view illustrating removing portions of the third spacer according to an exemplary embodiment.

Referring now to FIG. 11, the structure 100 with recessed portions of the third spacer 126, is shown in accordance with an embodiment. Once the ILD 138 between the two transistors is recessed, another etch process may be used to remove the portions of the third spacer 126 that are not protected by the mask 140. For example, the third spacer 126 is removed without further recessing the ILD 138. Removing portions of the third spacer 126 exposes portions of the top source drain 124 and portions of the dielectric material 122. In addition, the second etch process enlarges the opening 142.

Figure 12:
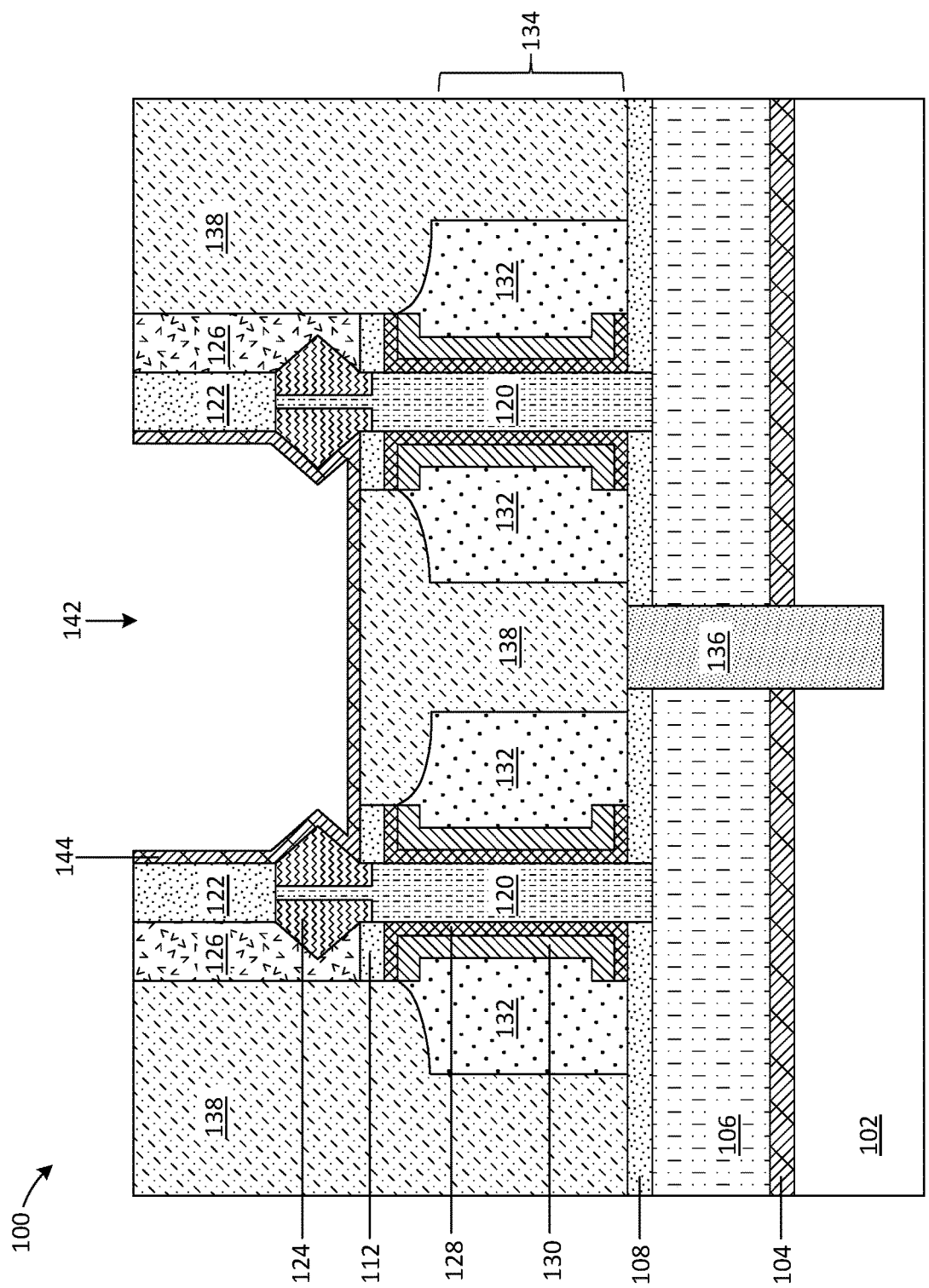
FIG. 12 is a cross section view illustrating depositing a switching layer according to an exemplary embodiment.

Referring now to FIG. 12, the structure 100 with a second oxide layer 144 is shown, in accordance with an embodiment. Once the portions of the third spacer 126 are removed, exposing portions of the top source drain 124, the mask 140 is removed. In addition, the second oxide layer 144 is conformally deposited in the opening 142, along the exposed sidewalls of the dielectric material 122 and the top source drain 124, as well as top surfaces of the second spacer 112 and the ILD 138.

The second oxide layer 144 may be conformally deposited using know deposition techniques, such as, for example the atomic layer deposition process. The second oxide layer 144 may be made of a metal oxide material or high-k materials. Non-limiting examples of suitable materials for the second oxide layer 144 may include titanium oxide, tantalum oxide, and hafnium oxide. The second oxide layer 144 serves as a dielectric layer in the ReRAM structure, separating the top source drain 124 from an electrode.

Figure 13:
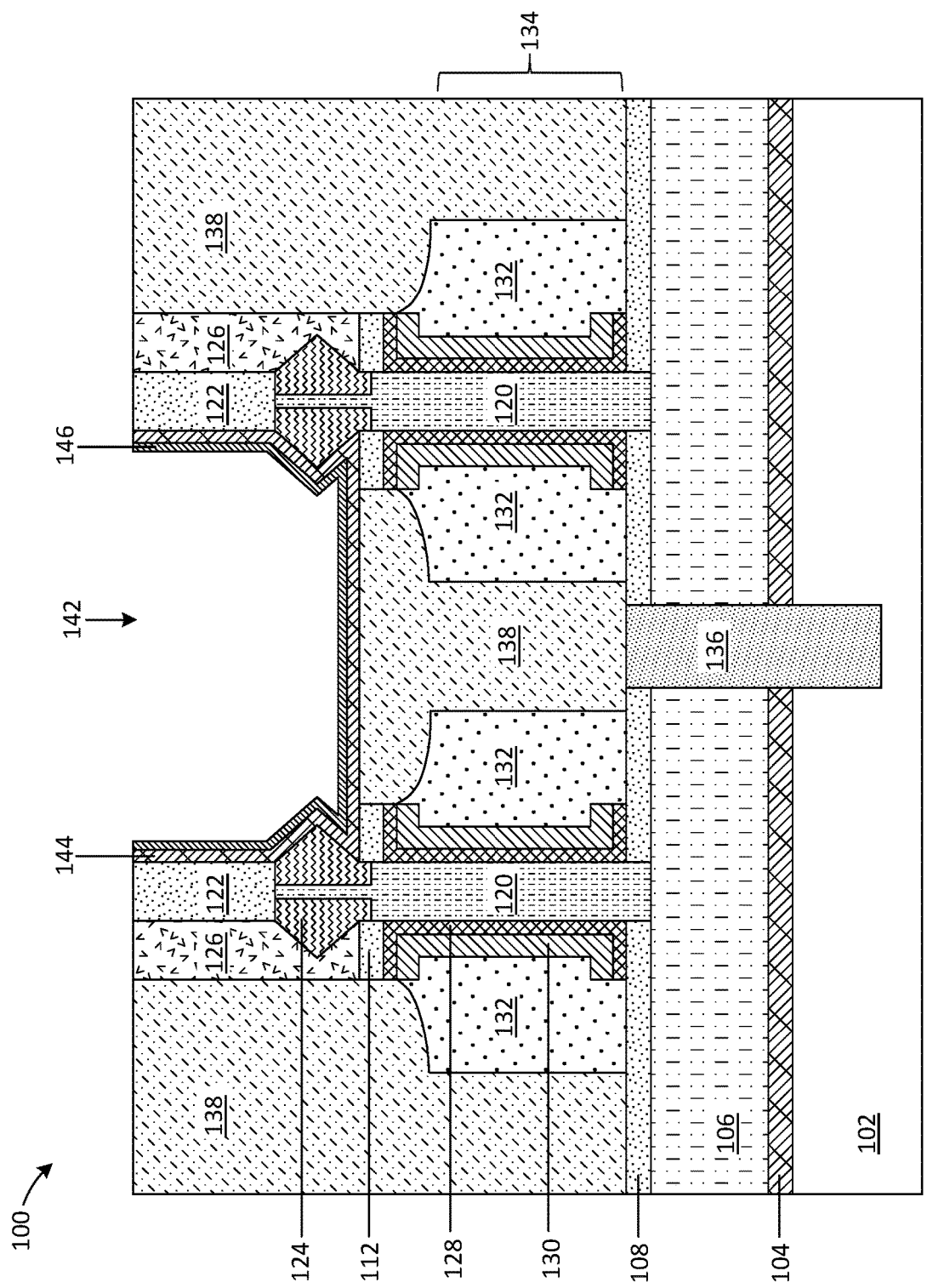
FIG. 13 is a cross section view illustrating depositing an electrode layer according to an exemplary embodiment.

Referring now to FIG. 13, the structure 100 with an electrode 146 is shown, in accordance with an embodiment. The electrode 146 may also be known as the top electrode in the ReRAM structure. The electrode 146 is conformally deposited on top of the second oxide layer 144. The electrode 146 may be deposited using known deposition techniques, such as, for example, atomic layer deposition. The electrode 146 may be made of material such as titanium nitride and aluminum doped titanium nitride. The electrode 146 serves as the top electrode in the ReRAM structure, whereas the top source drain 124 serves two functions. The top source drain 124 is the top source/drain of the vertical transistor, with the doped source 106 acting as the bottom source/drain of the vertical transistor. The top source drain 124 is also the bottom electrode in the ReRAM structure.

Figure 14:
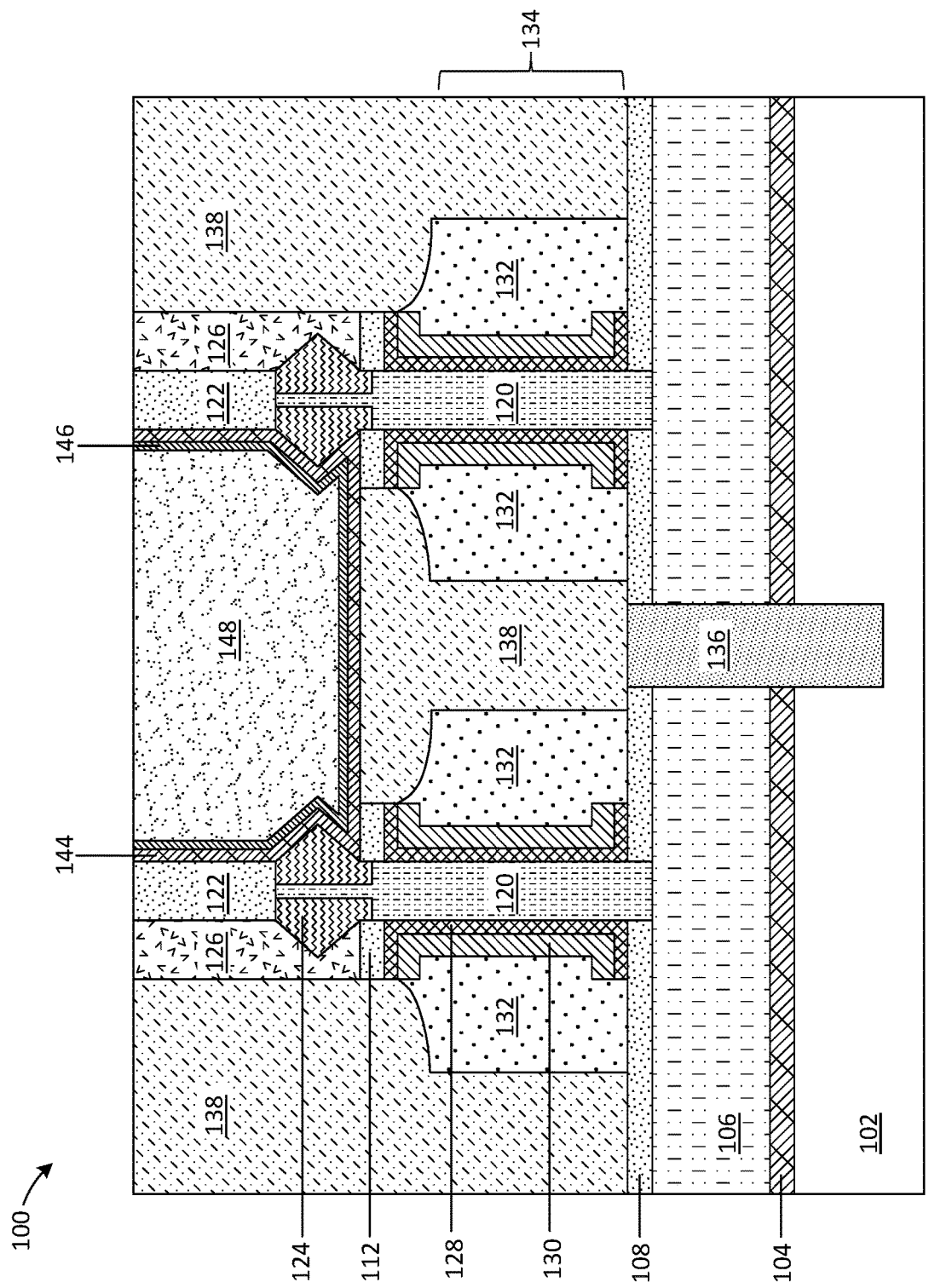
FIG. 14 is a cross section view illustrating depositing a metal fill according to an exemplary embodiment.

Referring now to FIG. 14, the structure 100 with a metal fill 148 is shown, in accordance with an embodiment. Once the electrode 146 is conformally deposited onto the sidewalls and bottom of the opening 142, the opening 142 is filled with the metal fill 148 after which, the structure 100 undergoes a CMP process. The metal fill 148 may be made of suitable low resistivity metal, such as, for example, tungsten or copper. The metal fill 148 serves as a conductor of electricity between the electrode 146 and contacts formed on the top surface of the metal fill 148.

Figure 15:
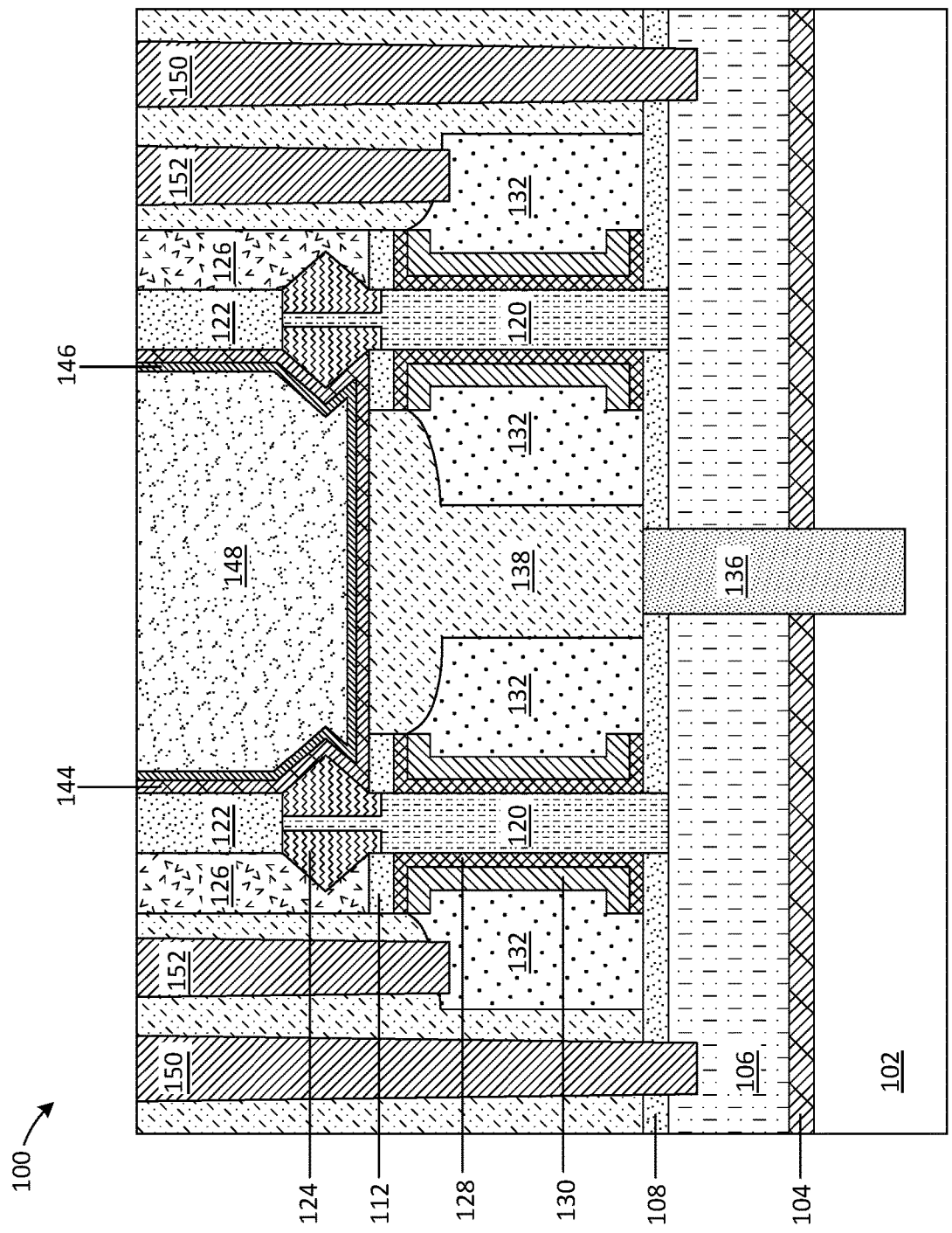
FIG. 15 is a cross section view illustrating forming contacts according to an exemplary embodiment.

Referring now to FIG. 15, the structure 100 with source contacts 150 and gate contacts 152 is shown, in accordance with an embodiment. The source contacts 150 extend through the ILD 138 and first spacer 108 to the doped source 106 and are formed within a trench. To remove the ILD 138 and form the source trenches, a resist, such as a photoresist, may be deposited and patterned. An etch process, such as a RIE, may be performed using the patterned resist as an etch mask to remove the ILD 138 and first spacer 108 until the doped source 106 is exposed. The source trenches are filled with a conductive material or a combination of conductive materials to form source contacts 150. The conductive material filling may be a conductive metal, for example, aluminum (Al), platinum (Pt), gold (Au), tungsten (W), titanium (Ti), or any combination thereof. The conductive material may be deposited by a suitable deposition process, for example, CVD, PECVD, PVD, plating, thermal or e-beam evaporation, or sputtering. A planarization process, for example, CMP, is performed to remove any conductive material from the surface of the ILD 138.

The gate contacts 152 extend from the surface of the ILD 138 to the metal gate material 132. The gate contacts 152 are formed by patterning a trench in the ILD 138. To remove the ILD 138 and form the gate contact trenches, a resist, such as a photoresist, may be deposited and patterned. An etch process, such as a RIE, may be performed using the patterned resist as an etch mask to remove the ILD 138 until the metal gate material 132 is exposed. The gate contact trenches are filled with a conductive material or a combination of conductive materials to form the gate contacts 152. The conductive material may be a conductive metal, for example, aluminum (Al), platinum (Pt), gold (Au), tungsten (W), titanium (Ti), or any combination thereof. The conductive material may be deposited by a suitable deposition process, for example, CVD, PECVD, PVD, plating, thermal or e-beam evaporation, or sputtering. A planarization process, for example, CMP, is performed to remove any conductive material from the surface of the ILD 138.

In addition to the source contacts 150 and the gate contacts 152, a ReRAM contact (not illustrated) may be subsequently formed above and in direct contact with the metal fill 148 of the ReRAM. The ReRAM contact may be made of conductive metal, for example, aluminum (Al), platinum (Pt), gold (Au), tungsten (W), titanium (Ti), or any combination thereof.

The resultant structure 100, as illustrated in FIG. 15, includes two vertical transport field effect transistors (VTFETs), separated by the STI 136, and the ReRAM structure located between the two VTFETs. The ReRAM structure includes the portion of the top source drain 124 that is in direct contact with the second oxide layer 144, the second oxide layer 144 and the electrode 146. The ReRAM structure has a tip region defined by a pointed cone of the top source drain 124, the second oxide layer 144, and the electrode 146 that are conformally deposited onto the tip region of the top source drain 124. The tip region of the ReRAM enhances the electroforming of a current conducting filament of the ReRAM. Thus, the randomness of electroforming of the current conducting filament is reduced in the ReRAM structure of the present invention. In addition, having the VTFETs integrated with the ReRAM structure saves space, allows for fabrication of more VTFETs on the same footprint.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:
   a first vertical transistor adjacent to a second vertical transistor;
   a resistive random access memory physically positioned between the first vertical transistor and the second vertical transistor.

2. The semiconductor structure of claim 1, wherein the resistive random access memory directly contacts top source drain regions of both the first vertical transistor and the second vertical transistor.

3. The semiconductor structure of claim 1, wherein the resistive random access memory directly contacts faceted sidewalls of top source drain regions of both the first vertical transistor and the second vertical transistor.

4. The semiconductor structure of claim 1, wherein an oxide layer of the resistive random access memory directly contacts faceted sidewalls of top source drain regions of both the first vertical transistor and the second vertical transistor.

5. The semiconductor structure of claim 1, wherein top source drains for each of the first vertical transistor and the second vertical transistor function as bottom electrodes of the resistive random access memory.

6. The semiconductor structure of claim 1, wherein a first vertical sidewall of an oxide layer of the resistive random access memory is coplanar with a vertical sidewall of a channel region of the first vertical transistor.

7. The semiconductor structure of claim 6, wherein a second vertical sidewall of the oxide layer of the resistive random access memory is coplanar with a vertical sidewall of a channel region of the second vertical transistor.

8. A semiconductor structure comprising:
   a first vertical transistor adjacent to a second vertical transistor;
   a resistive random access memory physically disposed between the first vertical transistor and the second vertical transistor, wherein a portion of the resistive random access memory is below uppermost surfaces of top source drain regions of the two vertical transistors.

9. The semiconductor structure of claim 8, wherein the resistive random access memory directly contacts the top source drain regions of both the first vertical transistor and the second vertical transistor.

10. The semiconductor structure of claim 8, wherein the resistive random access memory directly contacts faceted sidewalls of the top source drain regions of both the first vertical transistor and the second vertical transistor.

11. The semiconductor structure of claim 8, wherein an oxide layer of the resistive random access memory directly contacts faceted sidewalls of the top source drain regions of both the first vertical transistor and the second vertical transistor.

12. The semiconductor structure of claim 8, wherein the top source drains for each of the first vertical transistor and the second vertical transistor function as bottom electrodes of the resistive random access memory.

13. The semiconductor structure of claim 8, wherein a first vertical sidewall of an oxide layer of the resistive random access memory is coplanar with a vertical sidewall of a channel region of the first vertical transistor.

14. The semiconductor structure of claim 13, wherein a second vertical sidewall of the oxide layer of the resistive random access memory is coplanar with a vertical sidewall of a channel region of the second vertical transistor.

15. A semiconductor structure comprising:
    two vertical transistors each comprising a top source drain, a bottom source drain, and an epitaxial channel; and
    a resistive random access memory physically disposed between the two vertical transistors, the resistive random access memory comprising an oxide layer, a top electrode, and a bottom electrode, wherein the oxide layer contacts the top source drains of the two vertical field effect transistor.

16. The semiconductor structure of claim 15, wherein the resistive random access memory directly contacts faceted sidewalls of the top source drains of the two vertical field effect transistors.

17. The semiconductor structure of claim 15, wherein the oxide layer of the resistive random access memory directly contacts faceted sidewalls of the top source drains of the two vertical field effect transistors.

18. The semiconductor structure of claim 15, wherein the top source drains of the two vertical field effect transistors function as bottom electrodes of the resistive random access memory.

19. The semiconductor structure of claim 15, wherein a first vertical sidewall of the oxide layer of the resistive random access memory is coplanar with a vertical sidewall of a channel region of at least one of the two vertical field effect transistors.

20. The semiconductor structure of claim 19, wherein a second vertical sidewall of the oxide layer of the resistive random access memory is coplanar with a vertical sidewall of a channel region of the second vertical transistor.

* * * * *